United States Patent
Guan

(10) Patent No.: US 10,269,612 B2
(45) Date of Patent: Apr. 23, 2019

(54) HOLDING DEVICE HAVING ROBOT ARMS FOR SUPPORTING AND CLAMPING SUBSTRATE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Liwei Guan, Beijing (CN)

(73) Assignees: BOE TECHNOLOGY GROUP CO., LTD., Beijing (CN); ORDOS YUANSHENG OPTOELECTRONICS TECHNOLOGY CO., LTD., Inner Mongolia (CN)

( * ) Notice: Subject to any disclaimer, the term of this patent is extended or adjusted under 35 U.S.C. 154(b) by 0 days.

(21) Appl. No.: 15/966,233

(22) Filed: Apr. 30, 2018

(65) Prior Publication Data

US 2019/0067073 A1 Feb. 28, 2019

(30) Foreign Application Priority Data

Aug. 24, 2017 (CN) .......................... 2017 1 0735425

(51) Int. Cl.
| | |
|---|---|
| *B25J 15/10* | (2006.01) |
| *H01L 21/683* | (2006.01) |
| *H01L 21/68* | (2006.01) |
| *H01L 21/687* | (2006.01) |

(52) U.S. Cl.
CPC .......... *H01L 21/6838* (2013.01); *H01L 21/68* (2013.01); *H01L 21/68707* (2013.01); *H01L 21/68778* (2013.01)

(58) Field of Classification Search
CPC .................................................. H01L 21/6838
USPC ....... 294/213, 119.1; 414/222.01, 571.1, 941
See application file for complete search history.

(56) References Cited

U.S. PATENT DOCUMENTS

| | | | |
|---|---|---|---|
| 6,273,317 B1* | 8/2001 | Arai ....................... | B23K 1/085 228/33 |
| 6,540,468 B1* | 4/2003 | Blattner ............ | H01L 21/67763 414/416.08 |
| 7,401,828 B2* | 7/2008 | Yang .................... | B65G 49/061 294/119.1 |
| 7,520,545 B2* | 4/2009 | Kim ...................... | B65G 49/061 294/213 |
| 8,356,849 B2* | 1/2013 | Shirasaki ................... | B25J 1/00 294/119.1 |
| 8,465,072 B2* | 6/2013 | Wu ....................... | B65G 49/067 294/213 |
| 8,998,561 B2* | 4/2015 | Furuya ................. | B25J 11/0095 414/744.8 |

(Continued)

*Primary Examiner* — Paul T Chin
(74) *Attorney, Agent, or Firm* — Calfee, Halter & Griswold LLP

(57) ABSTRACT

A substrate holding device includes robot arms, wherein the robot arm includes a supporting portion for supporting a substrate; a plurality of substrate holding modules disposed on the robot arm. Each substrate holding module includes a linear guide mechanism, a substrate holding member, and a drive device for driving the substrate holding member to move along the linear guide mechanism between a first position in which the substrate holding member clamps the substrate and a second position in which the substrate holding member releases the substrate.

17 Claims, 3 Drawing Sheets

(56) References Cited

U.S. PATENT DOCUMENTS

| | | | | |
|---|---|---|---|---|
| 9,061,423 | B2* | 6/2015 | Pergande | B25J 15/0014 |
| 2004/0086368 | A1* | 5/2004 | Downs | B25J 15/0253 |
| | | | | 414/741 |
| 2004/0113444 | A1* | 6/2004 | Blonigan | H01L 21/68707 |
| | | | | 294/213 |
| 2005/0285419 | A1* | 12/2005 | Matsumoto | H01L 21/67742 |
| | | | | 294/213 |
| 2014/0312640 | A1* | 10/2014 | Yazawa | B25J 21/00 |
| | | | | 294/213 |
| 2016/0375590 | A1* | 12/2016 | Lessing | B25J 15/12 |
| | | | | 294/196 |

* cited by examiner

HOLDING DEVICE HAVING ROBOT ARMS FOR SUPPORTING AND CLAMPING SUBSTRATE

RELATED APPLICATION

This application claims priority to Chinese patent application No. 201710735425.0 filed on Aug. 24, 2017, the entire content of which is incorporated herein by reference.

FIELD OF THE DISCLOSURE

The present disclosure relates generally to the technical field of substrate production, and more particularly, to a substrate holding device for preventing a substrate, particularly a glass substrate, from sliding thereon in a vacuum environment.

BACKGROUND OF THE DISCLOSURE

Screens widely used in the market are liquid crystal displays (LCD) and organic light emitting diode displays (OLED display, hereinafter referred to as OLED). OLED displays include passive matrix organic light emitting diode (PMOLED) and active matrix organic light emitting diode (AMOLED) displays, wherein AMOLED displays are implemented in the configurations of low temperature polysilicon (LTPS) backplanes+fine metal masks (FMM) and of oxide backplanes+white light organic light emitting diodes+ color films.

The fine metal mask method is that OLED material is vapor-deposited on the LTPS backplane according to a predetermined program by a vapor deposition method, and a red, green and blue device is formed by utilizing a pattern on the FMM. The evaporation is carried out in a vacuum chamber, a glass substrate is taken from the upstream by a substrate holding device and sent to each chamber, and then taken out from the chamber and sent to the downstream by the substrate holding device after evaporation. The substrate holding device under the vacuum condition is different from the substrate holding device under the atmospheric condition. The substrate holding device under the atmospheric condition adsorbs the glass substrate to the substrate holding device through vacuum adsorption. However, the substrate holding device under the vacuum condition cannot adopt this method anymore and can only block the glass substrate by stop mechanisms without excessive sliding to fly out and damage the glass substrate. However, the defects of this method are that the substrate holding device can only operate at low speed; meanwhile, the position of the glass substrate sent to the evaporation chamber is different each time because the glass substrate is easy to slide on the substrate holding device under the vacuum condition, so that the alignment time is prolonged; and if the speed of the substrate holding device is increased, the risk that the glass substrate is easy to fly out to cause damage to the glass substrate is greatly increased. At present, it is urgent to shorten the production time and improve the productivity of single product.

SUMMARY OF THE DISCLOSURE

In view of this, an embodiment of the present disclosure provides a substrate holding device capable of clamping a supported substrate, such as a glass substrate, so that the substrate does not slide during high-speed operation of the substrate holding device, reducing the production time of a single product.

The substrate holding device provided by an embodiment of that disclosure comprise: robot arms, each of the robot arms including a supporting portion for supporting a substrate; a plurality of substrate holding modules disposed on the supporting portion, each of the substrate holding modules including a linear guide mechanism, a substrate holding member, and a drive device for driving the substrate holding member to move along the linear guide mechanism between a first position in which the substrate holding member clamps the substrate and a second position in which the substrate holding member releases the substrate.

According to an example of the present disclosure, the supporting portion is formed of a portion of the robot arm, and the linear guide mechanism includes a plurality of linear guide rails extending laterally in opposite directions from two sides of the supporting portions. One end of each linear guide rail away away from the supporting portion is provided with a substrate holding member, and the drive device comprises an electromagnetic module arranged on the linear guide rail, and the electromagnetic module is positioned at the side of the corresponding substrate holding member away away from the supporting portion and is connected with the substrate holding member through a spring. In the solution, the electromagnetic module applies magnetic force or does not apply magnetic force to the substrate holding member by adopting an electromagnet principle and by energizing and deenergizing the electromagnetic module.

In an alternative, the robot arm comprises two sub-robot arms, numbers of linear guide rails at two sides of the supporting portions are the same, and each of the linear guide rails is provided with an electromagnetic module. And, optionally, the linear guide rails located at two lateral sides of the supporting portions are symmetrical with respect to the supporting portions. With this configuration, the substrate holding module can clamp the substrate more firmly and stably.

In an alternative, in order to clamp the substrate, in particular the glass substrate more stably, a substrate holding member and an electromagnetic module, which are connected to each other through a spring, are also provided on two longitudinal sides of the supporting portion. The substrate holding member and the electromagnetic module herein are identical in structure and connection relationship to the substrate holding member and the electromagnetic module provided on the linear guide rail.

In an example, the substrate holding member is configured to include a first portion contacting the substrate and a second portion proximate the electromagnetic module, wherein the material of the first portion comprises polyetheretherketone (Peek) material, the material of the second portion comprises magnetic material, or the second portion is made of magnetic material such as ferromagnetic material. Optionally, the first portion comprises polyetheretherketone material doped with metal particles and carbon particles. However, it will be understood by those skilled in the art that the first portion may also be made of other suitable resilient materials, such as rubber. In order for the substrate holding member to have a better anti-slip effect, the first portion may be configured to have a certain roughness.

In the present disclosure, the first portion may be configured as an L-shaped structure. However, it will be understood by those skilled in the art that the shapes herein are exemplary only and that other shapes suitable for clamping the substrate are within the scope of the present application. For example, the first portion may be configured as an E-shaped structure, or a projection extending perpendicular to the vertical section of the L-shaped structure may be provided at the top end of the L-shaped structure.

In another aspect according to the present disclosure, a plurality of substrate holding modules include a plurality of branch portions extending laterally from two sides of the supporting portions, and the substrate holding member is disposed at one end of each of the branch portions away from the supporting portions. Optionally, the drive mechanism includes a lead screw-nut transmission mechanism disposed along a longitudinal direction of each of the branch portions, the substrate holding member is connected to a nut of the lead screw-nut transmission mechanism. The drive device also comprises a motor arranged near the supporting portions and used for driving the lead screw to rotate, thereby driving the nut to move linearly along the lead screw and further driving the substrate holding member to move linearly along the lead screw.

Optionally, a substrate holding member and a lead screw-nut transmission mechanism are provided at two longitudinal ends of the supporting portion, the substrate holding member is coupled to the motor via the lead screw-nut transmission mechanism.

In an example according to the present disclosure, the substrate holding member may be a slider disposed at each of the branch portions away from the supporting portions, wherein the lead screw is disposed at the bottom of the slider, the slider can move linearly along the lead screw to by the nut and clamping and releasing of the glass substrate by the slider is realized by clockwise and counterclockwise rotational movement of the motor. In the solution, the rotational movement of the motor can be converted into linear motion of the nut by adopting the lead screw-nut transmission mechanism, thereby driving the slider to move along the lead screw, thereby clamping or releasing the substrate to be transported. The slider comprises polyetheretherketone material, optionally polyetheretherketone material doped with metal particles and carbon particles. Of course, the slider may also be made of any other suitable material, such as rubber. The surface of the slider contacting the substrate may be configured to have a certain roughness in order to have a better anti-slip effect.

In an alternative, the slider may be configured as an L-shaped structure. However, it will be understood by those skilled in the art that the shapes herein are exemplary only and that other shapes suitable for clamping the substrate are within the scope of the present application. For example, the slider may be configured as an E-shaped structure, or a projection extending perpendicular to the vertical section of the L-shaped structure may be provided at the top end of the L-shaped structure In another solution of the present disclosure, the substrate holding member is configured as an elastic member. The elastic member comprises polyetheretherketone material, optionally polyetheretherketone material doped with metal particles and carbon particles. Alternatively, the elastic member may be made of rubber.

One of the solutions disclosed by the disclosure adopts an electromagnet principle and linear guide mechanisms to control the action of the substrate holding member to clamp and release the substrate, in particular the glass substrate, so as to ensure that the substrate dose not slide in the operation process of the substrate holding device. And another solution is to drive the substrate holding members to act by mean of a motor through a screw-nut transmission mechanism to clamp and release the substrate. Ensuring that the substrate does not slide has the following advantages: since the substrate is in a clamped state, the substrate holding device can operate at high speed, and the production time of a single product is reduced; since the substrate is in a clamped state, the substrate is sent to the same position in the evaporation chamber each time, so that the alignment is facilitated, the alignment time is reduced, and the production time of a single product is also reduced.

BRIEF DESCRIPTION OF THE DRAWINGS

Exemplary embodiments of the present disclosure are described below with reference to the accompanying drawings.

DETAILED DESCRIPTION OF THE DISCLOSURE

Exemplary embodiments of the present disclosure are described in detail below. The exemplary embodiments described below and illustrated in the accompanying drawings are intended to teach the principles of the disclosure to enable those skilled in the art to practice and use the disclosure in several different environments and for several different applications.

Figure 1:
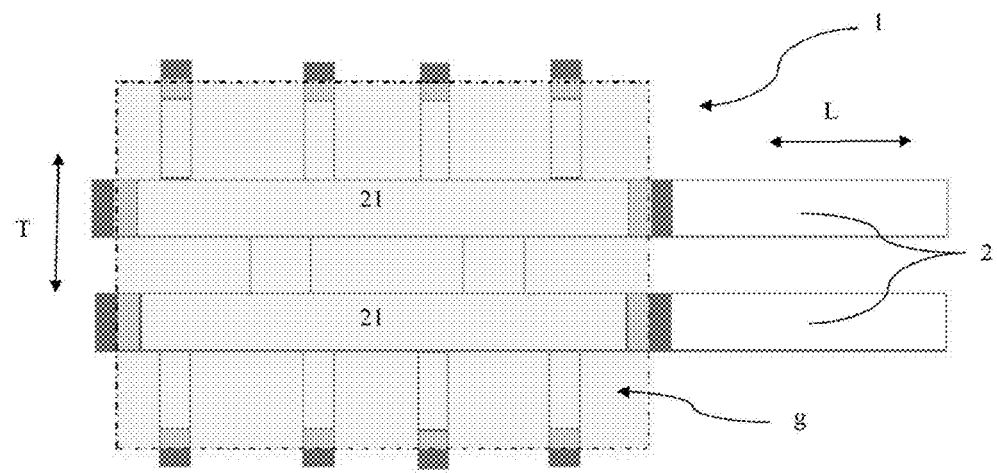
FIG. 1 shows a schematic structural view of a substrate holding device according to an embodiment of the present disclosure.

FIG. 1 shows a schematic structural view of a substrate holding device 1 according to an embodiment of the present disclosure, comprising two robot arms 2, each of the robot arms 2 comprising a supporting portion 21 for supporting a substrate (e.g. a glass substrate) g. The robot arm is an elongated structure having a longitudinal direction L (i.e., a lengthwise direction) and a transverse direction T (i.e., a widthwise direction) perpendicular to the longitudinal direction L. In this embodiment, the supporting portion 21 is constituted by a portion of the robot arm 2 and thus has the same longitudinal direction L and transverse direction T.

Figure 2:
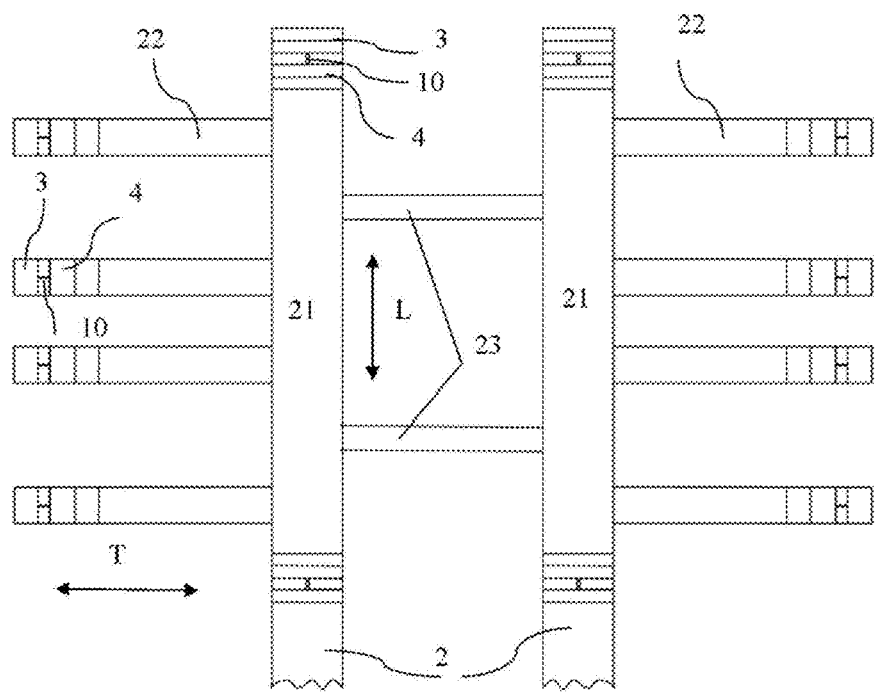
FIG. 2 illustrates a partial plan view of a substrate holding module according to an embodiment of the present disclosure.

FIG. 2 shows an embodiment of substrate holding modules provided on the robot arms 2. The two robot arms are connected by two beams 23, four linear guide rails 22 (also referred to as branch portions) extend from two sides of the supporting portions 21 laterally in opposite direction respectively, and the four linear guide rails 22 on one side and the four linear guide rails 22 on the other side are symmetrically distributed with respect to the supporting portions 21, wherein each substrate holding module comprises one linear guide rail. However, it should be understood that the number of eight linear guide rails shown in FIG. 2 is merely exemplary and that more or fewer linear guide rails may be selected depending on the size of the glass substrate g to be carried in practice.

Figure 5:
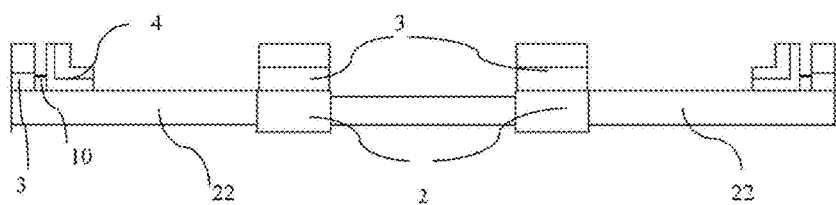
FIG. 5 shows a transverse partial view of a robot arm.

As shown in FIG. 5, an electromagnetic module 3 and a substrate holding member 4 are provided at the distal end (i.e., the end away from the supporting portion 21) of each linear guide rail 22. The substrate holding member 4 is located at the side of the electromagnetic module close to the supporting portion 21 and is slidably connected to the linear guide rail 22 and is slidable in the longitudinal direction of the linear guide rail 22 (i.e., in the transverse direction of the robot arm). And the substrate holding member 4 is connected to the electromagnetic module 3 through a spring 10. Wherein the electromagnetic module is fixed on the most distal end of the linear guide rail 22 and serves as a drive device for the substrate holding member 4. It should be understood, however, that clamping of the glass substrate g can also be achieved by providing the electromagnetic modules 3 on only four linear guide rails 22 located at one side of the supporting portion 21, for example at the left or right side.

Figure 6:
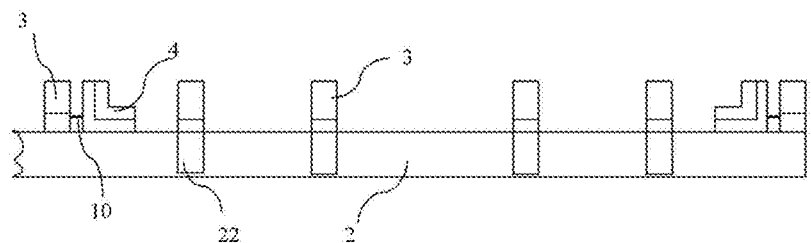
FIG. 6 shows a longitudinal partial view of the robot arm.

Alternatively, as shown in FIGS. 1, 2 and 6, two pairs of electromagnetic modules 3 and two pairs of substrate holding members 4 are also provided at two longitudinal ends (i.e., along the extension direction of the robot arm) of the two supporting portions 21 (one electromagnetic module 3 and one substrate holding member 4 disposed at each of the two longitudinal ends of each supporting portion 21), each electromagnetic module 3 is slidably connected to the supporting portion 21 and slidable in the longitudinal direction of the supporting portion 21. The electromagnetic module 3 and the substrate holding member 4 are connected through a spring 10. Wherein the electromagnetic module is fixed to the supporting portion 21 and serves as a drive device for the substrate holding member 4. That is, there are twelve electromagnetic module-substrate holding member groups in this embodiment, each group including one electromagnetic module and one substrate holding member. As shown in FIG. 1, when the glass substrate g is transported using the substrate holding device, the electromagnetic module-substrate holding member groups are distributed in four directions (front, rear, left, right) of the glass substrate g, and the glass substrate g can be firmly held. It will be understood by those skilled in the art that the electromagnetic module may also be disposed only in any two or three of the four directions of the front, rear, left, and right of the glass substrate g, which is also encompassed within the scope of the present application. In order to better support the glass substrate g, the supporting surface of the substrate holding member 4 on the supporting portion 21 and the supporting surface of the substrate holding member 4 on the linear guide rail 22 are at the same height.

Figure 3:
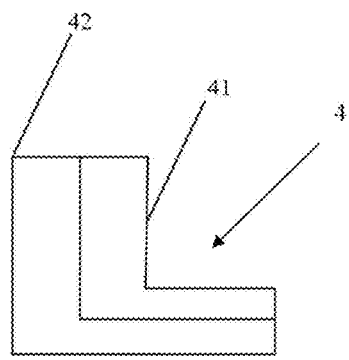
FIG. 3 shows a schematic structural view of an embodiment of the substrate holding member of FIG. 2.

FIG. 3 shows an embodiment of the substrate holding member 4. As can be seen from the figure, the substrate holding member 4 is L-shaped, comprising a first portion 41 in direct contact with the glass and a second portion 42 adjacent to the electromagnetic module, and both the first portion and the second portion are L-shaped, wherein the first portion comprises, for example, polyetheretherketone (Peek) material or is made of polyetheretherketone material, and the second portion comprises magnetic material or is made of magnetic material, such as ferromagnetic material. It will be appreciated that it is also possible to design only the first portion to be L-shaped and the second portion to be "l"-shaped.

Exemplarily, the first portion 41 comprises or is made of polyetheretherketone material doped with metal particles and carbon particles. However, it will be understood by those skilled in the art that the first portion may also be made of other suitable resilient materials, such as rubber. Also, the first portion may be configured to have a certain roughness in order to have a better anti-slip effect of the substrate holding member.

Figure 4:
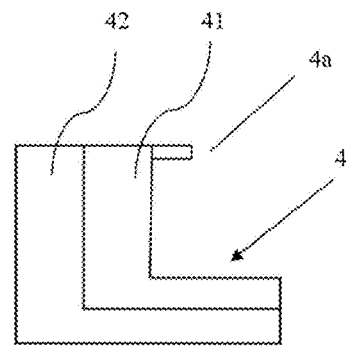
FIG. 4 shows a structural view of another embodiment of the substrate holding member of FIG. 2.

FIG. 4 shows another embodiment of the substrate holding member 4, in which the shape of the substrate holding member 4 is a variation of the L-shape shown in FIG. 3, comprising a projection 4a extending in a direction perpendicular to a vertical section at the top end of the L-shaped structure. The substrate holding member 4 includes a first portion 41 in direct contact with the glass substrate g and a second portion 42 adjacent to the electromagnetic module. In the present disclosure, the substrate holding member may alternatively be configured in an E-shape.

By configuring the substrate holding member 4, particularly the first portion 41 directly contacting the glass substrate g, to have a substantially E-shape, it is possible to better prevent the glass substrate g from flying out and to more stably hold the glass substrate g. Further, by making the first portion of Peek material, it is possible to prevent the glass substrate g from being damaged.

In the present embodiment, magnetism and non-magnetism are realized by energizing and de-energizing the electromagnetic module 3. When the electromagnetic module 3 is de-energized without magnetism, the substrate holding member 4 is urged by the spring 10 to press the substrate holding member 4 against the glass substrate g, that is, the substrate holding member 4 is in a first position to clamp the glass substrate g. When the electromagnetic module 3 is energized with magnetism, since the second portion of the substrate holding member 4 comprises or is made of magnetic material, the substrate holding member 4 is attracted by the electromagnetic module as a whole, at which time the substrate holding member 4 releases the glass substrate g so that the glass substrate is in a free state.

In general, when the glass substrate is taken by the substrate holding device from the upstream and then fed into the evaporation chamber or the glass substrate is transferred from the evaporation chamber to the downstream, the glass substrate is always in a clamped state during the rotation of the substrate holding device. The glass substrate is in a released state when the substrate holding device is receiving the glass substrate or after the glass substrate has been transferred downstream of the evaporation chamber. In the rotating process of the substrate holding device, the glass substrate is clamped, so that the substrate holding device can operate at high speed, and the production time of a single product is shortened. After the glass substrates is received from the upstream, the glass substrate is sent to the evaporation chamber in a clamped state, and the glass substrates do not slide in the conveying process, so that each glass substrate is ensured to be sent to the same position in the evaporation chamber, therefore alignment is facilitated, and alignment time is reduced.

Figure 7:
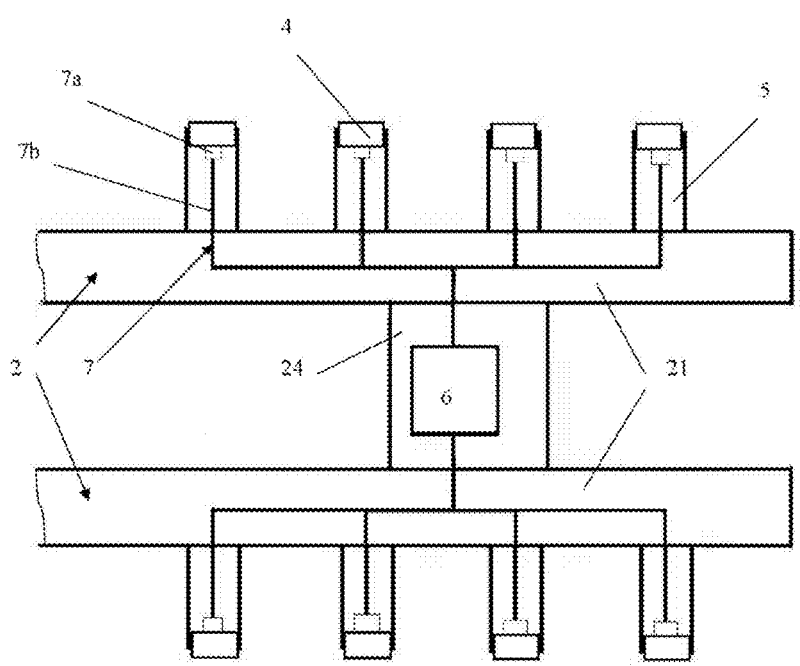
FIG. 7 illustrates a partial plan view of another embodiment of a substrate holding module according to the present disclosure.

FIG. 7 shows another embodiment of substrate holding modules provided on the robot arms 2. In this embodiment, the robot arms 2 comprises eight branch portions 5 extending laterally from two sides of the supporting portion 21, four on each side. Each substrate holding module comprises a substrate holding member 4 disposed at the distal end of each branch portion. A drive device is a motor 6 mounted in the vicinity of the supporting portion 21, for example on a flat plate 24 between the two robot arms 2. A lead screw-nut transmission mechanism 7 is arranged in the longitudinal direction of the portion branch 5 between the motor 6 and the substrate holding member 4. The substrate holding member 4 is fixedly connected to the nut 7a. By providing the lead screw-nut transmission mechanism, the rotational movement of the output shaft of the motor 6 can be converted into the linear motion of the nut, thereby driving the substrate holding member 4 to move linearly along the lead screw 7b. It should be noted that, as shown in FIG. 7, the original direction of the output shaft of the motor 6 is arranged in the longitudinal direction (i.e., the up-down direction) and becomes in the transverse direction (i.e., the left-right direction) after one conversion, which can be realized by two meshed gears (i.e., gear pairs). Similarly, a rotation shaft which is changed to be arranged in the transverse direction after one conversion and the lead screw 7b extending in the longitudinal direction may be engaged by a gear pair.

Exemplarily, the substrate holding member 4 is configured as a slider at the distal end of each of the branch portions, the lead screw 7b is provided at the bottom of the slider, the slider is fixedly connected to a nut 7a, the slider can move linearly along the lead screw 7b under the drive of the nut 7a, and therefore clamping and releasing of the glass substrate by the slider is achieved by clockwise or counterclockwise rotational movement of the motor. Similar to the previous embodiment, in this embodiment, the slider may be configured in an L-shaped or substantially E-shaped structure and comprise or be made of polyetheretherketone material. The substrate holding member 4 is an elastic member configured to have elastic force. For example, the elastic member may comprise or be made of polyetheretherketone material. Alternatively, the slider and the elastic member mentioned above may also be made of rubber. In order to improve the anti-slip effect of the substrate holding member, the surfaces of the slider and the elastic member to be in direct contact with the glass may be configured to have a certain roughness.

Similar to the previous embodiment, although not shown in FIG. 7, a substrate holding member and a lead screw-nut transmission mechanism may also be provided at two longitudinal ends of the supporting portion, the substrate holding member is coupled to the motor by the lead screw-nut transmission mechanism. In addition, a protective shell is arranged outside the motor, and the inside and outside of the protective shell are connected by magnetic fluid, so that the motor in the protective shell is completely isolated from the outside, and the atmospheric state in the protective shell ensures normal operation of the motor.

According to the substrate holding device provided by the two embodiments of the present disclosure, the problem that when the conventional vacuum substrate holding device blocks the glass substrate by the stop mechanisms, the glass substrate easily slides excessively and flies out to damage the glass substrate is overcome, and the defects that the substrate holding device cannot move at high speed and the placement position of the glass substrate is uncertain are overcome, so that the glass substrate does not slide when the substrate holding device operates at high speed under a vacuum environment.

Compared with conventional substrate holding device, the substrate holding device according to the present disclosure can clamp or release a substrate, in particular a glass substrate by the movement of the substrate holding member, and when the substrate is sent to the evaporation chamber, it can prevent the substrate in a clamped state from sliding while the substrate holding device operates at a high speed in a vacuum environment, and can ensure the substrate to be sent to the same position in the evaporation chamber, facilitate alignment, reduce the alignment time, thereby shortening the production time of a single product.

Although in the embodiments shown in the drawings, the substrate is a glass substrate, those skilled in the art will appreciate that the substrate holding device according to the present disclosure is also applicable to other types of substrates.

It should be noted that the above description is exemplary only and that various modifications and variations of the embodiments of the present disclosure may be made by those skilled in the art in light of the above description, which are within the scope of the present disclosure.

The invention claimed is:

1. A substrate holding device comprising:
robot arms, each of the robot arms comprising a supporting portion for supporting a substrate; and
a plurality of substrate holding modules disposed on the supporting portion, each of the substrate holding modules comprising a linear guide mechanism, a substrate holding member, and a drive device for driving the substrate holding member to move along the linear guide mechanism between a first position in which the substrate holding member clamps the substrate and a second position in which the substrate holding member releases the substrate;
wherein the substrate holding device is configured to enable the substrate to be in contact with both the supporting portion and the substrate holding modules when the substrate holding device is clamping the substrate.

2. The substrate holding device according to claim 1, wherein the supporting portion is formed by a portion of the robot arm.

3. The substrate holding device according to claim 1, wherein the linear guide mechanism comprises a plurality of linear guide rails extending in opposite directions laterally from two sides of the supporting portions.

4. The substrate holding device according to claim 3, wherein one end of each linear guide rail away from the supporting portion is provided with a substrate holding member, the drive device comprises an electromagnetic module provided on the linear guide rail, and the electromagnetic module is located on a side of the corresponding substrate holding member away from the supporting portion and connected to the substrate holding member through a spring.

5. The substrate holding device according to claim 4, wherein numbers of linear guide rails on the two sides of the supporting portions are the same, and each of the linear guide rails is provided with the electromagnetic module.

6. The substrate holding device according to claim 5, wherein a substrate holding member and an electromagnetic module connected to each other through a spring are provided at two longitudinal ends of the supporting portion.

7. The substrate holding device according to claim 6, wherein the substrate holding member comprises a first portion contacting the substrate and a second portion adjacent to the electromagnetic module, wherein a material of the first portion comprises a polyetheretherketone material and a material of the second portion comprises a magnetic material.

8. The substrate holding device according to claim 5, wherein the substrate holding member comprises a first portion contacting the substrate and a second portion adjacent to the electromagnetic module, wherein a material of the first portion comprises a polyetheretherketone material and a material of the second portion comprises a magnetic material.

9. The substrate holding device according to claim 4, wherein the substrate holding member comprises a first portion contacting the substrate and a second portion adjacent to the electromagnetic module, wherein a material of the first portion comprises polyetheretherketone material and a material of the second portion comprises magnetic material.

10. The substrate holding device according to claim 9, wherein the first portion is configured in an L-shaped structure, and the magnetic material is a ferromagnetic material.

11. The substrate holding device according to claim 1, wherein the plurality of substrate holding modules comprise a plurality of branch portions extending laterally in opposite directions from two sides of the supporting portions, and the substrate holding member is disposed at one end of each of the branch portions away from the supporting portion.

12. The substrate holding device according to claim 11, wherein the drive mechanism comprises a lead screw-nut transmission mechanism disposed along a longitudinal direction of each of the branch portions, and the substrate holding member is connected to the nut of the lead screw-nut transmission mechanism.

13. The substrate holding device according to claim 12, wherein the drive device further comprises a motor arranged near the supporting portions and used for driving the lead screw to rotate so as to drive the nut to move linearly along the lead screw, thus driving the substrate holding member to move linearly along the lead screw.

14. The substrate holding device according to claim 13, wherein the substrate holding member is a slider provided at a distal end of each of the branch portions, the lead screw is provided at a bottom of the slider, the slider is moved linearly along the lead screw by the nut, and a clamping and releasing of the substrate by the slider is realized by a rotational movement of the motor.

15. The substrate holding device according to claim 14, wherein the slider is configured in an L-shaped structure and comprises or is made of a polyetheretherketone material.

16. The substrate holding device according to claim 13, wherein a substrate holding member and a lead screw-nut transmission mechanism are provided at two longitudinal ends of the supporting portion, and the substrate holding member is coupled to the motor through the lead screw-nut transmission mechanism.

17. The substrate holding device according to claim 1, wherein the substrate holding member is an elastic member.

\* \* \* \* \*